United States Patent [19]

Ohmi et al.

[11] Patent Number: 4,733,632

[45] Date of Patent: Mar. 29, 1988

[54] WAFER FEEDING APPARATUS

[75] Inventors: Tadahiro Ohmi, Sendai; Hiromi Kumagai, Tokyo; Yoshiaki Yanagi, Sagamihara, all of Japan

[73] Assignee: Tokyo Electron Limited, Tokyo, Japan

[21] Appl. No.: 911,362

[22] Filed: Sep. 25, 1986

[30] Foreign Application Priority Data

| | | | |
|---|---|---|---|
| Sep. 25, 1985 | [JP] | Japan | 60-211643 |
| Oct. 1, 1985 | [JP] | Japan | 60-218452 |
| Oct. 14, 1985 | [JP] | Japan | 60-228349 |
| May 9, 1986 | [JP] | Japan | 61-106487 |

[51] Int. Cl.⁴ ........ B05C 13/02

[52] U.S. Cl. ........ 118/729; 118/500; 361/234

[58] Field of Search ........ 118/729, 500; 361/234; 269/903

[56] References Cited

U.S. PATENT DOCUMENTS

| | | | |
|---|---|---|---|
| 4,184,188 | 1/1980 | Briglia | 361/234 |
| 4,480,284 | 10/1984 | Iojo et al. | 361/234 |
| 4,542,712 | 9/1985 | Sato et al. | 118/729 X |

*Primary Examiner*—John P. McIntosh
*Attorney, Agent, or Firm*—Oblon, Fisher, Spivak, McClelland & Maier

[57] ABSTRACT

A wafer feeding apparatus comprises a horizontally movable arm section, an electrostatic chuck mechanism having a vertically movable support member attached to the arm section and moving mechanism for moving the support member, and an electrostatic chuck attached to the support member and having two semi-circular electrodes located in a manner to be electrically isolated from each other and each having a wafer attraction section and an insulating film formed on the wafer attraction section. A direct-current voltage is across the electrodes to electrostatically attract a semiconductor wafer to the wafer attraction sections of the electrodes through the insulating film.

8 Claims, 20 Drawing Figures

F I G. 3A
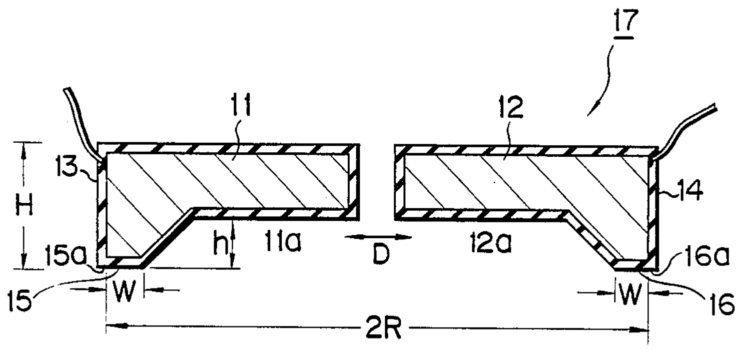
F I G. 3B
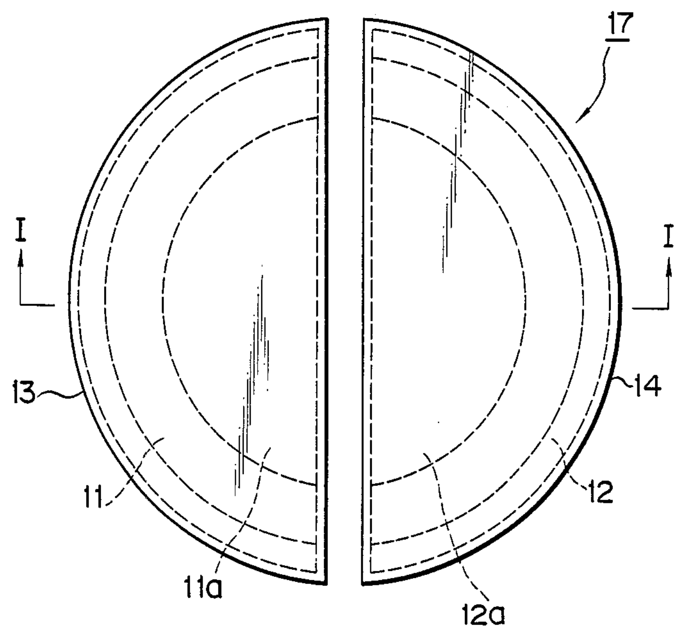

F I G. 8
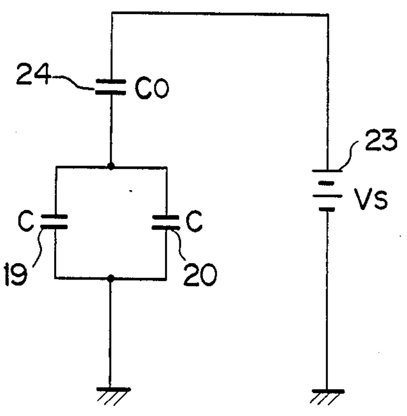
F I G. 9A
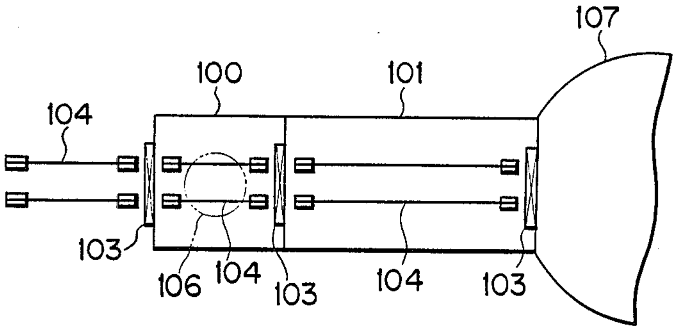
F I G. 9B
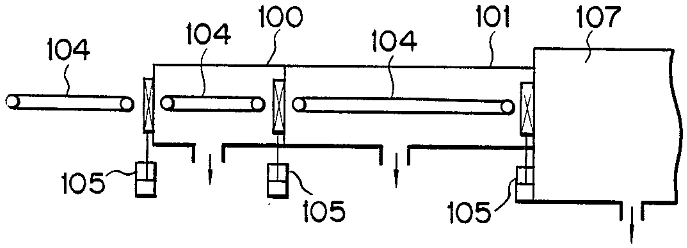

F I G. 10A
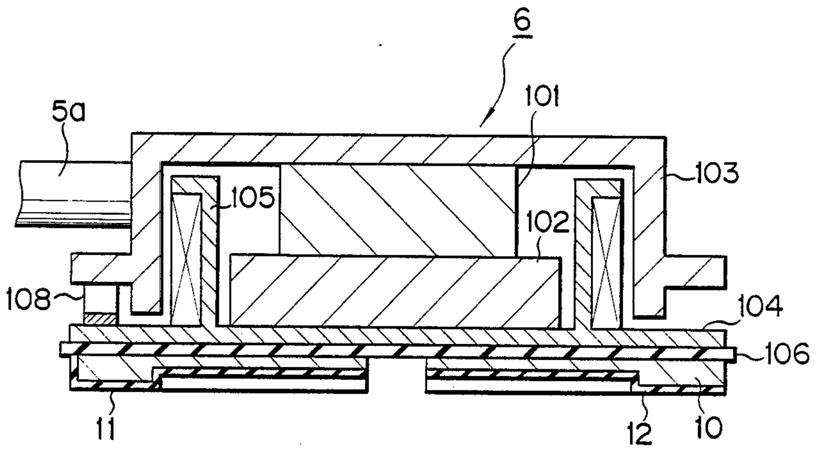
F I G. 10B
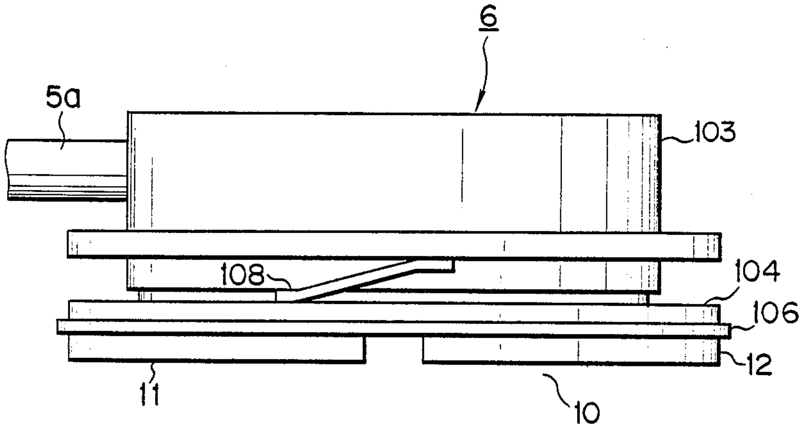

WAFER FEEDING APPARATUS

BACKGROUND OF THE INVENTION

This invention relates to a wafer feeding apparatus used in a semiconductor manufacturing apparatus for such as an LSI (large scale integrated circuit).

In a conventional CVD apparatus, sputtering apparatus, etc., a wafer is fed from a preparatory chamber to a processing chamber through a belt conveying mechanism, a vacuum suction mechanism, etc. These apparatuses include many movable components.

Such a wafer feeding mechanism includes a greater number of mechanical movable component parts. In the vacuum suction apparatus in particular, an air stream influences the generation of particles in view of the negative pressure of a suction mechanism. An increasing amount of particles is unavoidably generated, thus presenting the difficulty of restricting this amount to below a predetermined level.

In an evaporation, CVD, plasma etching, reactive ion etching apparatus for instance, a vacuum chuck cannot be employed for processing under low pressure. As a wafer holding mechanism attached to the wafer feeding mechanism, use is often made of a mechanical means, such as a wafer holder and holding arm, thus involving a greater number of movable component parts.

It is therefore difficult to implement a low-temperature process as well as a high selective process.

SUMMARY OF THE INVENTION

It is accordingly the object of this invention to provide a wafer feeding apparatus which can overcome the problems encountered in the prior art, can hardly generate particles on a wafer feeding mechanism and can be used under ordinary pressure or reduced pressure in particular and under a low temperature environment in the manufacturing process of a semiconductor device.

BRIEF DESCRIPTION OF THE DRAWINGS

FIG. 3A is a cross-sectional view as taken along line I—I in FIG. 3B and FIG. 3B is a plan view showing an electrostatic chuck section;

FIG. 8 shows an equivalent circuit of FIG. 7;

FIGS. 9A and 9B are a plan view and side view showing a wafer feeding apparatus with attention focused on its preparatory chamber; and FIGS. 10A and 10B show another variant of electrostatic chuck mechanism of a wafer feeding apparatus of this invention.

DETAILED DESCRIPTION OF THE PREFERRED EMBODIMENTS

A wafer feeding apparatus according to one embodiment of this invention will be explained below with reference to FIGS. 1 to 4.

Figure 1:
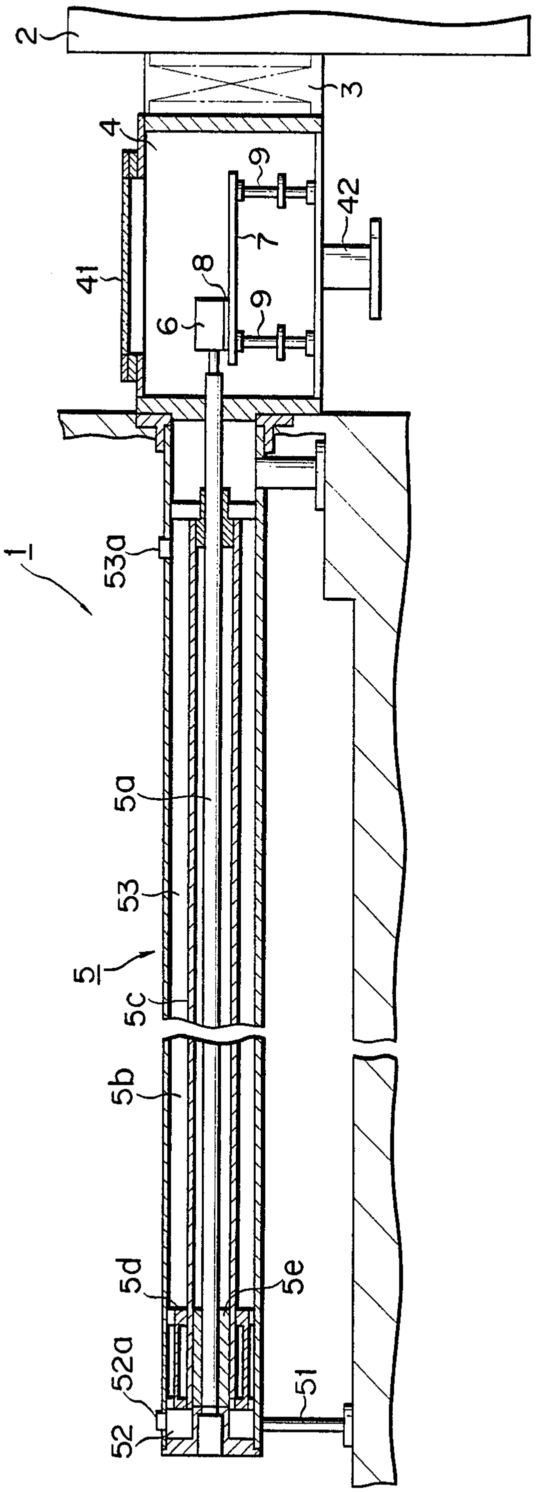
FIG. 1 is a cross-sectional view schematically showing a machine as applied to a wafer feeding apparatus with attention focused on a preparatory chamber.

Arm section 5 is provided in preparatory chamber 4 of wafer feeding apparatus 1 as shown in FIG. 1 with the preparatory chamber connected to reaction chamber 2 through gate 3. This section includes tubular arm 5aand air cylinder 5b, and electrostatic chuck section 6 is fixed to the forward end of tubular arm 5a. Preparatory chamber 4 has window 41 of a light-transmissive material on the upper side and vacuum vent 42 on the bottom side. Within preparatory chamber 4, susceptor 7 is disposed to support semiconductor wafer 8 as a sample. Susceptor 7 is placed on support base 9 which is fixed to the bottom of preparatory chamber 4.

Within air cylinder 5b, inner cylinder 5c is disposed in a concentric fashion. Arm 5a is disposed within inner cylinder 5c and annular permanent magnet 5d is disposed such that it can be slidably moved along the outer peripheral surface of the inner cylinder and inner wall surface of air cylinder 5b. The permanent magnet separates the interior of cylinder 5b into first and second chambers 52 and 53. Permanent magnet 5e is attached to arm 5a at a location opposite to permanent magnet 5e. When permanent magnet 5d is moved, permanent magnet 5e is also moved, in the same direction, under an attractive force of permanent magnets. At one end portion of air cylinder 5b, first port 52a is provided which permits first cylinder chamber 52 to communicate with a pressure source, not shown. At the other end portion of air cylinder 5b, second port 53a is provided to permit second cylinder chamber 53 to communicate with a pressure source, not shown. When arm 5a is moved toward reaction chamber 2, high pressure air is introduced into first chamber 52 through first port 52a and vented through second port 53a. On the other hand, when arm 5a is moved away from reaction chamber 2, high pressure air is introduced into second cylinder chamber 53 through second port 53a and vented from first port 52a.

The electrostatic chuck mechanism will be explained below with reference to FIGS. 2A and 2B.

Figure 2A:
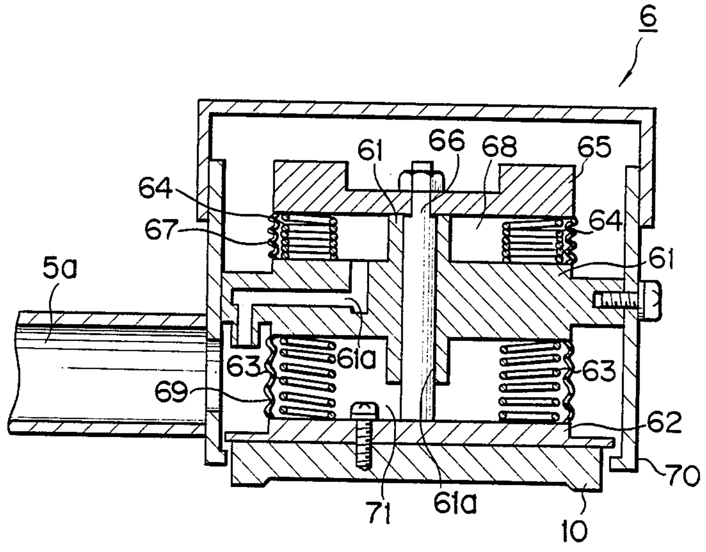
FIGS. 2A and 2B are cross-sectional views showing an electrostatic chuck section in different states.
Figure 2B:
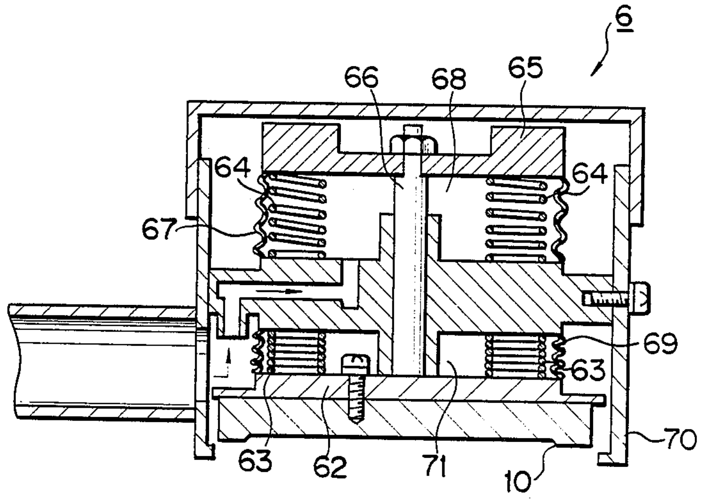

In FIG. 2A, reference numeral 70 shows a housing opened at a lower end. Bearing plate 61 is fixed in the housing to separate into upper and lower zones. Housing 70 is connected at the lower portion to arm 5a so that the housing communicates with a passage of arm 5a. An axial through hole is provided at the center of bearing plate 61 such that it extends in a vertical direction. Shaft 66 is freely inserted into the axial through hole and movable in the vertical direction. Back plate 65 and movable base 62 are fixed to the upper and lower end portions, respectively, of shaft 66 such that the back plate is located opposite to the movable base with a predetermined distance left therebetween. A pair of coil springs 64, 64 are provided between bearing plate 61 and back plate 65 to bear the load of the back plate. A pair of coil springs 63 are stretched between bearing plate 61 and movable base 62. Between the outer peripheral edges of axial bearing 61 and back plate 65, bellows 69 are mounted to provide upper chamber 68. Between the outer peripheral edges of axial bearing 61 and movable base 62, bellows 69 are mounted to provide lower chamber 71. Channel 61*a* is formed in bearing plate 61 to permit upper chamber 68 to communicate with the lower annular spacing of the housing. Upper chamber 68 communicates with the passage of arm 5*a* through channel 61*a* and then through the lower annular spacing of the housing. Lower chamber 71 is independently separated from the other chamber and spacing. To the lower surface of movable base 62, electrostatic chuck 10 is fixed with a wafer attraction section down, i.e., with the wafer attraction section located opposite to susceptor 7.

The operation of the electrostatic chuck mechanism will be explained below.

Where a semiconductor wafer is placed on susceptor 7 or attracted away from susceptor 7, movable base 62 or electrostatic chuck 10 is moved down as shown in FIG. 2A. Where, on the other hand, a wafer attracted to electrostatic chuck 10 is moved in a horizontal direction, that is, moved into the preparatory chamber or retracted back, movable base 62 is brought to its upper position. The movable base is moved up and down by supplying (in the state in FIG. 2B) or venting (in the state in FIG. 2A) compressed air through the passage of arm 5*a* and channel 61*a* of bearing plate 61.

As shown in FIGS. 3A and 3B, electrode unit 17 of electrostatic chuck 10 is comprised of first and second electrodes 11 and 12 made of semicircular conductors, such as a metal, in which case it defines a pair of semicircular recesses 11*a*, 12*a* at their inner lower surfaces.

The pair of first and second electrodes 11, 12 are wholly covered with a thin insulating film (13, 14) with a predetermined distance D left as viewed from their straight opposite faces. In this connection it is to be noted that a spacing defined by that predetermined distance may or may not be filled with an insulating material. This choice may be determined from the whole structure of electrostatic chuck 10.

As shown in FIG. 3A, a circular unit comprising first and second electrodes 11 and 12 is inwardly recessed with semicircular portions of a width W left at their outer marginal portions, noting that the aforementioned semicircular portions of the first and second electrodes provide wafer attraction sections 15 and 16. Insulating films 15*a* and 16*a* are coated as the portions of insulating films 13 and 14, respectively, and their thicknesses are determined by, for example, a wafer attraction force. The thickness of the remaining portions of insulating films 13 and 14 is determined, taking into consideration the fact that their electrodes have an adequate withstand voltage if being brought into contact with the other electrode.

The attraction of the semiconductor wafer by electrostatic chuck electrode section 17 will be explained below.

Figure 4A:
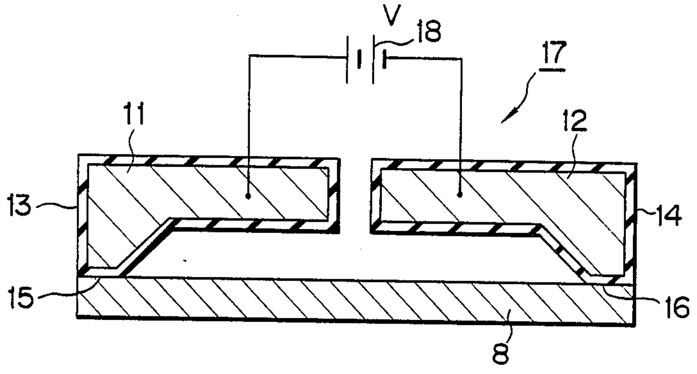
FIG. 4A is a cross-sectional view showing a wafer attracted to the electrostatic chuck section.

As seen from FIG. 4A, semiconductor wafer 8 is attracted to wafer attraction sections 15 and 16 located at the outer marginal portions of electrode unit 17. Where wafer 8 is automatically conveyed, it is held by the attraction force of electrostatic chuck 10 with the surface of the wafer up. In this state, the wafer is fed from preparatory chamber 4, i.e., a starting point to reaction chamber 2, i.e. a destination point. In this respect the electrostatic chuck is different from a mere vacuum chuck whereby a wafer is usually fixed in a manner to be sucked from its reverse side. Reference numeral 18 is a voltage source (voltage level V) of the electrostatic chuck.

Usually devices, such as integrated circuits and large-scale integrated circuits, are not formed at the outer marginal portion of disc-like wafer 8, i.e., several millimeters inside the outer marginal portion of disc-like wafer 8. It is therefore possible to attract that outer marginal portion of wafer 8 by electrode unit 17 without deteriorating the characteristics of ICs or LSIs. FIG. 4A shows the case where the outer diameter of electrostatic chuck 10 substantially corresponds to that of wafer 8.

In order to drop wafer 8 under its own weight the width W as set forth above may usually be set to about 0.1 to 3 mm, preferably about 0.2 to 1 mm. The wafer is less contaminated or damaged with the width W set as a narrower width. Needless to say, an adequate consideration must be paid to a contact pressure with which electrode unit 17 is brought into contact with wafer 8. It is also necessary to set the contact pressure to a level at which a fault, such as dislocation, never occurs in the wafer.

The diameter (2R) of electrode unit 17 may be set to be somewhat greater or smaller than that of wafer 8. In order to exactly locate electrode unit 17 over wafer 8 and thus positively attract the wafer to the electrostatic chuck, however, the diameter of wafer 8 may be set to be substantially equal to, or somewhat greater than, the diameter (2R) of electrode unit 17.

Various kinds of wafers are used in the manufacture of semiconductor devices. As a wafer use is made of a material, such as Si, Ge, GaAs, InP. The resistivity, $\rho$, of the wafer varies within a range of about $10^8$ to $10^{-3}$ $\Omega\cdot$cm, depending upon the material of the wafer. This is because there are cases where an insulating film, such as an oxide, is formed on the wafer surface on the order of 1 $\mu$m or a resist film is formed on the insulating film.

The dielectric relaxation time, $\tau d$, of the wafer is given by:

$$\tau d = \rho\epsilon \quad (1)$$

Suppose that, here, $\rho\epsilon = 1\times10^8$ to $1\times10^{-3}$ $\Omega\cdot$cm. In this case the dielectric relaxation time, $\tau d$, given by Equation (1) becomes about $1\times10^{-4}$ to $1\times10^{-15}$ sec. That is, the wafer material may be treated as a conductor in terms of DC, if the resistivity is set to be within this range.

Figure 4B:
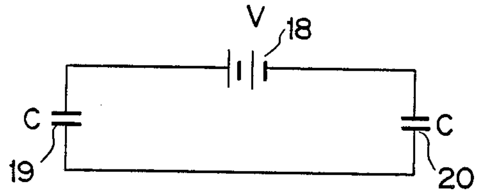
FIG. 4B shows an equivalent circuit of the electrostatic chuck section.

If, as shown in FIG. 4A, the state in which wafer 8 is attracted to electrodes 11 and 12 of electrode unit 17 is expressed in terms of an electrical circuit, a circuit as shown in FIG. 4B is obtained in which capacitors 19 and 20 corresponding to the wafer attraction sections 15 and 16 are connected in series with voltage supply terminal 18. The capacitance C of the capacitor is given by $$C = \frac{\epsilon i S}{\delta} \quad (2)$$

where $\delta$ and S denote the thickness of the insulating film of the wafer attraction section and area of the wafer attraction section; and $\epsilon i$ denotes the dielectric constant of the insulating film.

The capacitance of the capacitor C varies, depending upon the thickness of the insulating film on the wafer, thickness of the resist, resistivity of the wafer, etc.

From the radius (R) in FIG. 3B, the area of the wafer attraction section is substantially given by:

$$S \approx \pi RW \quad (3),$$

provided

R>>W and R>>D

The relation of R and D is not necessarily restricted to the aforementioned relation. A force F acting upon the capacitor can be expressed as follows:

$$F = \frac{\epsilon^2 S V^2}{8\epsilon 0 \delta^2} \quad (4)$$

where

V stands for a power source voltage.

In FIG. 4B a voltage applied to one of the capacitors is given by V/2. A force f (newton) for lifting wafer 8 can be expressed as follows:

$$f = 2F = \frac{\epsilon^2 S V^2}{4\epsilon 0 \delta^2} \quad (5)$$

The mass M and weight f of the wafer are given by:

$$M = \rho 0 \pi R^2 t \quad (6)$$

$$f = MG = \rho 0 \pi R^2 t G \quad (7)$$

where $\rho 0$: the specific gravity

R : the radius of the wafer t : the thickness of the wafer

G : the acceleration rate of a gravity (9.8 m/sec$^2$)

The mass M and weight f of the silicon wafer are given by the following Table:

| Mass & Weight of.Si Wafer | | | | |
|---|---|---|---|---|
| Wafer | 2R | t | M | f |
| 2" | $5.08 \times 10^{-2}$ m | $3 \times 10^{-4}$ m | 1.41 g | $1.39 \times 10^{-2}$ N |
| 4" | $1.016 \times 10^{-2}$ m | $4 \times 10^{-4}$ m | 7.54 g | $7.39 \times 10^{-2}$ N |
| 6" | $1.524 \times 10^{-2}$ m | $5 \times 10^{-4}$ m | 21.22 g | $2.08 \times 10^{-1}$ N |
| 8" | $2.032 \times 10^{-2}$ m | $6 \times 10^{-4}$ m | 45.27 g | $4.44 \times 10^{-1}$ N |

The specific gravity, $\rho 0$, of Si is:

$$2.328 \text{ g/cm}^3 = 2.328 \times 10^3 \text{ kg/m}^3$$

From Equations (5) and (7) a voltage necessary to attractively lift the wafer of a weight given by Equation (7) will be:

$$V = \frac{2\delta}{\epsilon}\sqrt{\frac{\epsilon 0 f}{S}} = \frac{2\delta}{\epsilon^x}\sqrt{\frac{f}{\epsilon 0 S}} = \frac{2\delta}{\epsilon^x}\sqrt{\frac{\rho 0 R t G}{\epsilon 0 W}} \quad (8)$$

where $\epsilon^x$ denotes the relative dielectric constant of the insulating film.

A voltage V necessary to attractively lift the wafer with an air gap x left relative to the insulating film, i.e., when it is not completely in contact with the insulating film, can be given by:

$$V = 2\left(x + \frac{\delta}{\epsilon^x}\right)\sqrt{\frac{f}{\epsilon 0 S}} \quad (9)$$

With, for example, R=50 mm, W=5 mm, D=10 mm, $\delta$=10 $\mu$m and $\epsilon^x$=2.5, a voltage V necessary to attractively lift the wafer of M=2.36 g (f=$2.31 \times 10^{-2}$N) becomes 24 V from Equation (9). Needless to say, since the wafer is not completely attached by electrostatic chuck 10 to be insulating film, a voltage of about a few hundreds of volts (a value greater than the aforementioned value) will be required.

Where for a 7-inch wafer use is made of an electrostatic chuck having a pair of electrodes made of aluminum with an insulating film covered on the electrodes, wafer 8 can readily be attracted, under a voltage of about 500 V, to the wafer attraction sections for delivery, provided that R=50 mm, D=10 mm, $\delta$=10 $\mu$m, $\epsilon^x$ =2.5 and W (the width of the wafer attraction sections 15*a*and 16*a*)=5 mm. Usually, the surface of the wafer is flat on the order of a few angstroms and, when being attracted to the electrode unit of the electrostatic chuck, the wafer is not separated from the electrostatic chuck under its own weight even if the applied voltage is returned to a "0" voltage.

The problem as encountered when the wafer is fed with the use of electrode unit 17 of the electrostatic unit is the separation of wafer 8 from the wafer attraction section of electrode unit 17. In the aforementioned electrostatic chuck for the 7-inch wafer, the wafer can be attracted to the wafer attraction section with a width W of, for example, 5 mm or greater, but it cannot be dropped away from the wafer attraction section under its own weight merely by an electrical operation per se, though depending upon the diameter of the wafer. The addition of any extra separation mechanism causes a possible increase in the generation of particles. It is preferred that the wafer be attracted to, dropped under its own weight from, the wafer attraction sections.

Where the width W of the wafer attraction sections 15*a* and 16*a* of electrodes 11 and 12 in the electrode unit of the electrostatic chuck is set to be about 0.2 mm to 1 mm, then the wafer can be attracted to the wafer attraction section under an application voltage of 500 to 700 V. Where the application voltage is reduced to below about 200 to 300 V, then the wafer can be dropped from the electrostatic chuck under its own weight. Where the wafer, while being attractively held, is fed forward, the width W of the wafer attraction section should adequately be narrowed to such an extent that the wafer can be dropped under its own weight from the chuck. Cutouts may be provided in places at the outer marginal portion of the wafer attraction section with the width W of the wafer attraction section set to be about 1 to 2 mm. The effective wafer attraction section may be set smaller than a predetermined value.

Thus the width of the wafer attraction section is basically related to its whole attraction area.

In this way the wafer can be attractively lifted at its marginal portion, i.e., at an area about 1 mm inside its outer periphery and fed forward in a manner to be supported at the lower side of electrostatic chuck 10. As appreciated from the above, a near-ideal wafer feeding apparatus can be provided which hardly damages or contaminates a device (ICs or LSIs) formation area of the wafer.

Wafer feeding apparatus 1 having the electrode unit at the electrostatic chuck will be explained below.

Wafer 8 is fed through a belt conveying mechanism and another handling mechanism to preparatory chamber 4 in a vertical direction as viewed from FIG. 1 and placed on susceptor 7.

When high pressure air is exhausted through channel 61*a* communicating with upper chamber 68 by means of bellows as shown in FIG. 2A, movable base 62 is vertically lowered to permit electrostatic chuck 10 to be attached to the marginal portion of wafer 8. At this time a voltage of above a predetermined level, such as above 500 V, is applied to electrodes 11 and 12 of electrostatic chuck 10 to cause wafer 8 to the wafer attraction section. When a predetermined amount of high pressure air is introduced into upper chamber 68 from channel 69 communicating with upper chamber 68, movable base 62 is moved slightly upward against the forces of springs 63, 63, and 64, 64 to allow electrostatic chuck to be moved away from the upper surface of susceptor 7 with wafer 8 held as it is.

In this state, when high pressure air is introduced into cylinder chamber 52 and air in cylinder chamber 53 is exhausted, then air cylinder 5*b* is moved ahead, advancing arm 5*a* toward reaction chamber 2 and opening the gate (3) to allow wafer 8 to be fed into reaction chamber 2.

The forward movement of arm 5*a* is, stopped at a proper position on a susceptor within reaction chamber 2 and high pressure air is removed from the interior of bellows 67, causing electrostatic chuck 10 to be lowered and stopped at such a place that wafer 8 is in contact with, or in close proximity to, the susceptor within reaction chamber 2. When a voltage across electrodes 11 and 12 in electrostatic chuck 10 is dropped below a predetermined level, wafer 8 is released under its own weight.

Then high pressure air is introduced into cylinder chamber 53 and air in cylinder chamber 52 is vented, causing arm 5*a* to be retracted from reaction chamber 2 and closing the gate (3) with the result that arm 5*a* is retracted back to an initial position.

It is desired that, in order to hold the wafer surface under a clean circumstance and prevent particles from being deposited on the surface of the wafer even in the reaction chamber, the wafer be held, for example, at a vertical position or at such a tilting angle as to permit it to face downward.

When the wafer is to be taken out of preparatory chamber 4, it is fed from reaction chamber 2 back to preparatory chamber 4 by an operation opposite to that as set forth above. In this way the wafer is transferred between the susceptor of the preparatory chamber and that of the reaction chamber.

Figure 5A:
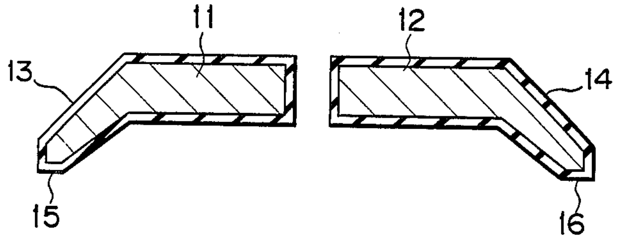
FIGS. 5A and 5B show the configuration of one form of chuck electrodes and FIG. 5C is an expanded view showing a wafer attraction section of the chuck electrode of FIG. 5B.
Figure 5B:
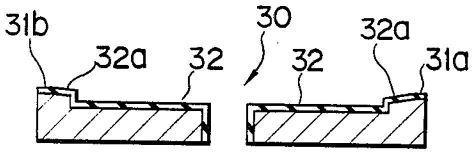
Figure 5C:
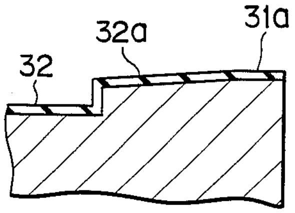

FIG. 5A shows another form of the electrostatic chuck section. In electrostatic chuck 10, wafer attraction sections 15 and 16 are provided at the inclined outer marginal edge portion in order to make the weight of the electrodes lighter and the exactly located electrostatic chuck relative to the wafer. Similarly, in electrostatic chuck section 30 as shown in FIG. 5B wafer attraction sections 31*a* and 31*b* of respective electrodes are about 1 to 2 mm in width and, for a 7-inch wafer structure, about 1.5 mm. In another form of the electrostatic chuck section as shown enlarged in FIG. 5C, wafer attraction section 31*a* is so formed that it is adjacent to area 32*a* of about 3 mm in width which is inclined at an angle of about 2 to 3° with substantially semicircular recess 32 formed inside the respective electrode.

Figure 6A:
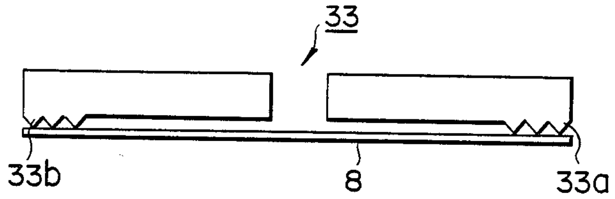
FIGS. 6A, 6B, 6C and 6D show the configuration of another form of chuck electrodes.
Figure 6B:
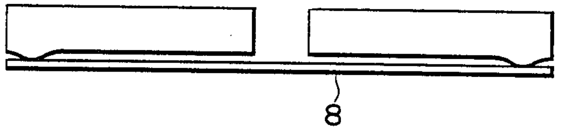

FIG. 6A shows another form of the electrode unit. In this form of the electrode unit wafer attraction sections 33*a* and 33*b*, which are wavy in cross-section, are formed at respective electrodes of electrostatic chuck section 33 in which case peak in the wavy area is about 0.2 to 1 mm. In a form of an electrode unit as shown in FIG. 6C, a relatively gently curved area is provided as a wafer attraction section at respective electrode sections of an electrode unit.

Figure 6C:
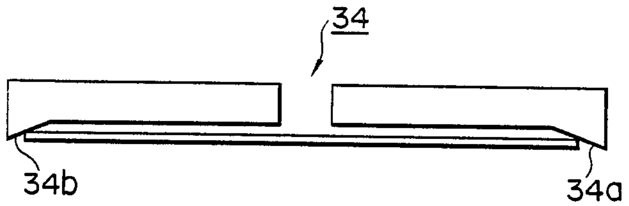
Figure 6D:
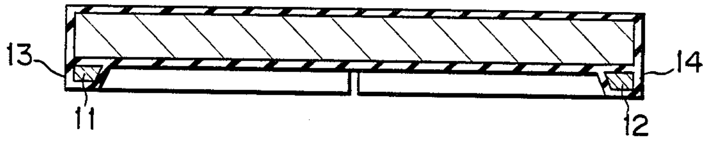

FIG. 6C shows an electrode unit where wafer 8 is attracted not at its major surface, but at an outer peripheral edge portion. This is a structure where the wafer is contaminated to the least possible extent. In this form of the electrode unit, wafer attraction sections 34*a*, 34*b* are gently inclined at the respective electrode sections of that electrode unit. In an electrostatic chuck section use is made of an electrode unit whose electrodes are a partially circular ring-like in configuration, rather than a partially circular in configuration. In this form, semicircular ring-like electrodes 11 and 12 are formed near an insulating film (for example, an anodized aluminum)-coated outer peripheral edge portion of a circular substrate and insulating layers 13 and 14, such as a Teflon, are formed on the surface of electrodes 11 and 12.

In either case, so long as the wafer is electrically attracted to, and released under its own weight from, the electrostatic chuck section, any electrostatic chuck may be employed, provided that the electrostatic chuck section can attract the wafer at the outer marginal portion by applying a DC voltage across at least two seperted electrodes at the electrode unit of the electrostatic chuck section so that no adverse effect is caused at the major surface of the water.

An explanation has been given as to the mechanism for applying a voltage to the wafer as well as the mechanism for releasing the wafer from the electrostatic chuck section under its own weight by returning the application voltage to either a zero volt level or a voltage level below a predetermined level.

Since the wafer has only to be attracted with its major surface up, it is only necessary to return the application voltage to a zero volt level, or a voltage level below a predetermined level, at a necessary location. For example, the wafer is attracted by the electrostatic chuck, transferred to a proper place in reaction chamber 2 and placed at that location on the susceptor (substrate) within reaction chamber 2, or moved into light contact with, or in close proximity to, the susceptor and placed at a proper place on the susceptor through the returning of the application voltage to the zero voltage level.

In order to prevent a contamination from on a wafer-placed susceptor in a plasma process on, for example, a reactive ion etching (RIE) apparatus, a susceptor structure is often used with associated electrodes covered with an insulating material. It is often required that the wafer temperature be controlled with the wafer placed in intimate contact with the susceptor. The wafer may be released by applying an AC voltage across the associated electrodes with a DC voltage discontinued.

It is required that the wafer be located in a vertical position or be oriented with its surface down. Since in this case the wafer is attracted by the electrostatic force to the electrostatic chuck section, the electrostatic chuck section may be rotated or moved in any arbitrary direction with the wafer oriented vertically or downward.

Figure 7:
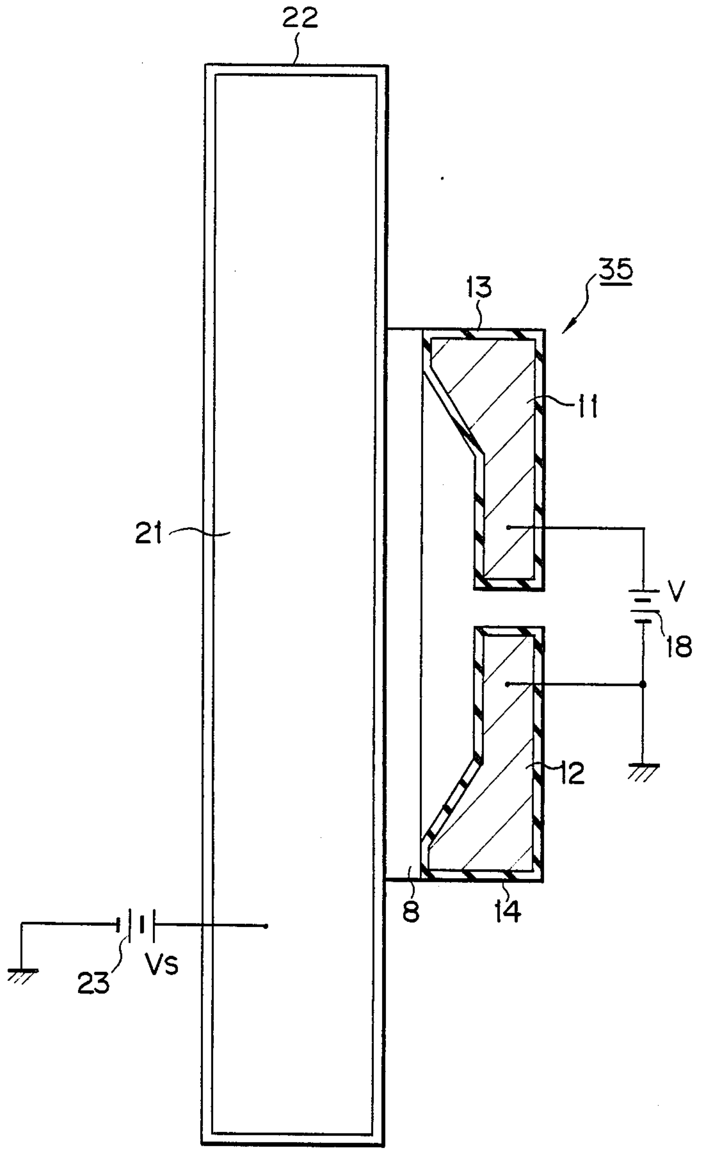
FIG. 7 is a view showing a wafer vertically attracted to a vertical susceptor in an embodiment of this invention.

FIG. 7 shows the case where a wafer is supported vertically. In the case of FIG. 7, wafer 8 is transferred to susceptor 21 which is grounded in the vertical state and set at that proper location.

With wafer 8 attracted to electrostatic chuck section 35 the wafer is brought into contact with susceptor 21 covered with insulating material 22. In this state, a voltage Vs is applied to susceptor 21, causing a voltage which has been impressed across voltages 11 and 12 on electrode chuck section 35 to be set to a zero volt level. This state can be expressed in terms of an electric circuit, as shown in FIG. 8. Reference numerals 19 and 20 denote capacitors (C, C) across wafer 8 and electrodes 11 and 12. Reference numeral 11 denotes a capacitor C0 formed across susceptor 21 and wafer 8.

A voltage V0 applied to capacitor C0 is given by:

$$V0 = \frac{2C}{C0 + 2C} \cdot Vs \tag{10}$$

Wafer 8 is placed, under that electrostatic force, in intimate contact with susceptor 21. Thereafter, if chuck 35 is moved away from susceptor 21, then the wafer is placed at a proper location on susceptor 21.

Although the susceptor has been explained as being grounded on the negative electrode side of a power source V, it may be grounded on the positive electrode side of the power source V. The positive or negative potential of a power source Vs may be employed. The whole system should be considered in a proper combination.

In the variant form of the electrode unit, as shown in FIGS. 3A and 3B, the thickness "h" of electrodes 11 and 12 may be preferably made thinner within an allowable mechanical accuracy level so that electrostatic chuck section 17 may not be made too large or too heavy. For example, the thickness "h" of the electrodes may be selected to be about 3 mm to 2 cm, depending upon the material of which the electrode is made.

The electrode material may be any conductor so long as it conducts current. Any electroconductive material may be used as such if it can offer a simpler electrical connection member, such as a wire. For example, use is made as such of a metal, such as aluminum and stainless steel or of a semiconductor material, such as silicon, which is obtained by adding an impurity at a certain high impurity level. That material should be determined from the circumstances where the present apparatus is employed.

As the insulating film to be coated on, for example, the wafer attraction section a somewhat heat-resistant insulating material may be selected which neither contaminates the silicon wafer nor evolves a greater quantity of gas in a vacuum. For example, use may be made as such of an imide-based resin such as a polyimide and of fluorine-based resin, such as a Teflon. The thickness of the insulating film of the wafer attraction section may be enough great to obtain an adequate voltage. As evident from Equation (8) the greater the thickness "δ" of the insulating film, the greater the voltage V required to attract the wafer will be increased in ratio with the thickness "δ".

If a system is used which conducts almost no current, it is very easy to provide an insulation against a voltage of about 1000 to 2000 V. For an insulation film of about 10 to 50 μm in thickness, for example, an adequate wafer attraction can be provided at an electric power of 500 to 1000 V even if use is made of either a polyimide-based resin or fluorine-based resin.

Although in the aforementioned embodiment a rodless air cylinder has been explained as being used to drive the arm forward and backward between the preparatory chamber and the processing chamber to allow the wafer to be transferred from the preparatory chamber to the processing chamber, any type of a movement mechanism may be used so long as an arm section can be moved directly from the preparatory chamber to the processing chamber and back to the preparatory chamber.

Although in the aforementioned embodiment the air cylinder type has been explained as the mechanism for moving the electrostatic chuck section up and down, it is not restricted thereto. If, for example, a shape memory alloy is used for such an up-down movement mechanism, the up-and-down movement can be controlled under an electric control.

Although in the aforementioned embodiment the wafer has been explained as attracting the wafer to the electrostatic chuck section and placing it on a proper place, the wafer attraction section may take various shapes, depending upon the shape of the wafer as well as the state in which the wafer is transferred, so that the wafer can be smoothly placed on, and removed from, a proper place.

A variant of the electrostatic chuck mechanism will be explained below with reference to FIGS. 10A and 10B.

Disc-like permanent magnet 101 is made of, for example, a rare-earth/cobalt-based material and plated at its surface with nickel. Magnet 101 is fixed to centerpiece 102 made of a metal of a high magnetic permeability, such as SS41, to provide a unit which is centrally located within container-like yoke 103 made of the same material as set forth above. This arrangement provides a magnetic circuit.

Circular bobbin 104 is made of a paramagnet, such as alumina, and provided at one surface with circular coil 105 made of, for example, a polyimide-coated electric wire and projected upward as viewed from FIG. 10A and at the other surface with electrostatic chuck 10 having a pair of semicircular electrodes 11 and 12 and attached to the aforementioned unit through insulating sheet 106 such as a Teflon. This arrangement provides a wafer holding assembly.

Circular coil 105 of bobbin 104 is inserted into an annular air gap defined by permanent magnet 101 and centerpiece 102 and yoke 103, and elastically supported by three leaf springs 108 which are located between yoke 103 and bobbin 104. In this way electrostatic chuck mechanism 6 is provided which is disposed at the forward end of the wafer feeding apparatus or arm 5a and electrically connected to a control apparatus not shown.

When a current I flows through coil 105, a force F indicated by $$F = IBl\sin\theta$$

is applied to coil 105, where

B: the magnetic flux density of permanent magnet 101

θ: the angle defined by the magnetic flux in relation to coil 105 l: the length of coil 105

Bobbin 104 is elastically held by leaf springs 108. The distance by which bobbin 104 is moved up and down is determined by a balance between the spring constant of the leaf spring and the force F.

An amount of current I through coil 105 and variation of the current per unit time are controlled by the control apparatus, not shown, to permit the bobbin movement distance and speed to be controlled.

The wafer feeding apparatus of this invention includes an arm section moved back and forth in a direction in which the preparatory chamber is connected to a processing chamber, such as a reaction chamber, and electrostatic chuck having a plurality of electrodes for attractively holding a wafer and attached to the arm section to cause the wafer to be fed with the wafer attracted to the electrostatic chuck, whereby the forward and backward movement of the arm section can be properly controlled to cause the wafer to be fed from the preparatory chamber to the processing chamber to allow the wafer to be properly held and place it on a proper location under an electric control.

As a result, a wafer feeding apparatus can be implemented which can reduce the number of movable component parts required, can reduce the generation of particles to a lesser extent and can achieve a low-temperature process and higher selective process.

The adoption of the electrostatic chuck allows the use of either an ordinary or a lower pressure.

What is claimed is:

1. A wafer feeding apparatus comprising:

a movable arm section;

an electrostatic chuck transporting mechanism having a movable support member attached to said arm section and movable in a direction different from that in which the arm is movable and moving mechanism for moving the support member;

an electrostatic chuck attached to said support member of said electrostatic chuck transporting mechanism and having a plurality of electrodes located in a manner to be electrically isolated from each other and each having a wafer attraction section and an insulating film formed on the wafer attraction section; and means for applying a direct-current voltage across the electrodes to electrostatically attract a semiconductor wafer to the wafer attraction sections of the electrodes through the insulating film.

2. A wafer feeding apparatus according to claim 1, in which said electrodes have opposite faces with a predetermined spacing left therebetween.

3. A wafer feeding apparatus according to claim 1, in which each of said electrodes has a sectional shape and are arranged in a circle.

4. A wafer feeding apparatus adapted to feed a semiconductor wafer onto a susceptor located within a preparatory chamber and feed it from there to another location, which comprises:

an arm section movable in a horizontal direction and having a portion movable into and out of the preparatory chamber;

an electrostatic chuck transporting mechanism having a support member attached to said portion of said arm section and vertically movable toward and away from said susceptor and movable mechanism or moving said support member;

an electrostatic chuck attached to said support member of said electrostatic chuck transporting mechanism, including wafer attraction sections opposite to said susceptor and having a plurality of plate-like electrodes electrically isolating from each other and an insulating layer attached to the electrode and providing said wafer attraction section; and means for applying a direct-current voltage between the electrodes to allow the semiconductor wafer to be attracted to the electrodes through said insulating film.

5. A wafer feeding apparatus according to claim 4, in which said wafer attraction sections of said electrostatic chuck attract said semiconductor wafer at a location near the outer curved marginal portion of that wafer.

6. A wafer feeding apparatus according to claim 5, in which said electrodes are comprised of semicircular sections and provide a circular array as a whole and the whole surfaces of said respective electrodes are covered with said insulating film.

7. A wafer feeding apparatus comprising:

an electrostatic chuck having electrode means comprised of a plurality of semicircular electroconductive plates each having a flat portion and a curved marginal portion, and an insulating layer formed on at least one surface of the curved marginal portion, the curved marginal portions being arranged on a circular line to form a wafer attraction section; and means for moving said electrostatic chuck.

8. A wafer feeding apparatus according to claim 7, in which said electrode means has a diameter substantially the same as that of a semiconductor wafer.

* * * * *